(12) United States Patent
Gabara

(10) Patent No.: US 6,255,875 B1
(45) Date of Patent: Jul. 3, 2001

(54) HIGH-SPEED CLOCK-ENABLED LATCH CIRCUIT

(75) Inventor: Thaddeus John Gabara, Murray Hill, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/452,611

(22) Filed: Dec. 1, 1999

Related U.S. Application Data

(62) Division of application No. 08/906,784, filed on Aug. 6, 1997, now Pat. No. 6,018,260.

(51) Int. Cl.[7] .................................................. H03K 3/356
(52) U.S. Cl. ......................... 327/201; 327/210; 327/212; 327/55; 327/57
(58) Field of Search ..................................... 327/415, 416, 327/141, 144, 152, 154, 161, 162, 163, 201, 200, 208, 209, 210; 341/100

(56) References Cited

U.S. PATENT DOCUMENTS

| | | | |
|---|---|---|---|
| 4,672,647 | * | 6/1987 | Yamaguchi et al. ................... 377/77 |
| 4,901,076 | * | 2/1990 | Askin et al. ........................... 341/100 |
| 5,101,203 | * | 3/1992 | Bersbach et al. ..................... 341/100 |
| 5,345,121 | * | 9/1994 | Itoh ....................................... 327/208 |
| 5,541,596 | * | 7/1996 | Yoshida ................................ 341/100 |
| 5,612,695 | * | 3/1997 | Ueda .................................... 341/101 |

* cited by examiner

Primary Examiner—Tuan T. Lam

(57) ABSTRACT

A novel latch circuit configuration that substantially reduces inverter-based setup and hold times. The latch circuit includes first and second input switches connected to an effective sense amplifier configuration. It is possible for the input switches to receive complementary signals of a balanced input signal. The latch circuit operates in initialization and output modes based on the signal level of an alternating clock signal. The output mode produces an output signal having a first or second signal magnitude based on the magnitude of the input signal at the end of the initialization mode. Also, disclosed is a high-speed serial-to-parallel converter based on this latch circuit.

8 Claims, 4 Drawing Sheets

HIGH-SPEED CLOCK-ENABLED LATCH CIRCUIT

This application is a division of application Ser. No. 08/906,784, filed Aug. 6, 1997, now U.S. Pat. No. 6,018,260.

FIELD OF THE INVENTION

The invention relates to latch circuits useable for latching and maintaining a particular signal level.

BACKGROUND OF THE INVENTION

Modern electronic products including, for example, consumer electronics, computers, telecommunication equipment and automobile electronics, use latch circuits to store data during data processing operations. Latch circuits are bistable devices having output signals assuming one of two stable states based on a signal level or signal transition of an input signal. Conventional latch circuits include dynamic and static latch circuits. Typical dynamic latches generally require less circuitry than static latches and have faster times to latch input signals representing data values. However, the electrical charge stored in a dynamic latch used for producing the one of two output signal levels tends to dissipate through current leakage and disadvantageously requires such charge to be intermittently refreshed for maintaining the proper output signal level.

In contrast, an operational state maintained by a static latch does not change over a period of time. Conventional latches generally employ a feedback between a latch output to an input of the latch to compensate for leakage preventing the state of the latch from changing. A schematic diagram of a typical prior art static latch 1 having a clocked feedback path is shown in FIG. 1. In FIG. 1, an input signal IN having a first or second logic level is provided to a first inverter 5 connected to a first switch 10 controlled by clock signal CLK. The switch 10 is further connected to a node A that is further connected to a second inverter 15. The output of inverter 15 is connected to yet a third inverter 20 and provides output signal OUT of the latch 1. The output of inverter 20 is connected to a second switch 25 that is further connected to the node A. The second switch 25 is controlled by a complement clock signal $\overline{CLK}$. The clock signal $\overline{CLK}$ provides a signal having a complementary signal level to that of the clock signal CLK.

In operation, the signal level of the clock signal CLK determines whether the latch 1 is in a sample period or a hold period. When the clock signal CLK is at a high signal level, and correspondingly the complementary clock signal $\overline{CLK}$ is at a low signal level, the switch 10 is closed connecting the inverter 5 to node A and the switch 25 is opened disconnecting the output of inverter 20 from node A. As a consequence, the latch is in the sample period, wherein the logic level of the signal IN is inverted by the inverter 5 to generates a signal at the node A having a complementary signal level. This signal at the node A is then inverted again by the inverter 15 to produce the output signal OUT having the same signal level of the input signal IN. Accordingly, while in a sample period, the output signal OUT of the latch 1 tracks or is held to the signal level of the input signal IN. If the logic level of the input signal changes during the sample period, then the output signal OUT changes accordingly after an operational delay of the inverters 5 and 15. Also, the output signal OUT is provided to the inverter 20 which generates a signal at the open switch 25 having a complementary signal level to the output signal OUT. This inverted signal is used during the hold period.

When the clock signal CLK goes to a low signal level, the switch 10 is opened disconnecting the inverter 5 from node A and the switch 25 is closed connecting the inverter 20 to node A. As a result, the latch is in the hold period, wherein the signal generated by the inverter 20 having a complementary logic level to the input and output signals IN and OUT during the sample period is provided to the node A and inverter 15. The inverter 15 then continuously generates the output signal OUT at the same level as during the end of the sample period of the latch. Thus, the latch 1 maintains or latches the signal level of the input signal IN as the output signal OUT level near the end of the sample period. During the hold period, changes in signal level of the input signal IN have no effect on the output signal OUT.

However, each of the inverters 5, 15 and 20 produces a processing delay that is dependent on the voltage, temperature and process used to fabricate the inverters. Such delays sometimes disadvantageously operate with transitions of the clock signal CLK to provide an erroneous output signal OUT signal level. For instance, if the input signal IN undergoes a signal level transition immediately before the clock signal CLK undergoes a signal level transition, it is uncertain whether the latch will properly update the output signal OUT due to the inverter delays.

These inverter delays and switching delays in relation to the clock signal transitions, referred to as setup and hold delays, limit the speed at which the latch 1 is able to setup and hold data represented in the input signal. Conventional static latches have setup and hold delays of typically greater than 500 psec. In other words, there is a 500 psec. or greater interval before a clock signal transitions from a sample period to a hold period, wherein no change in the output signal OUT would likely occur despite a change in the input signal IN. As a result, conventional static latches are undesirably limited to processing signals having data rates of less than 1 Gigabit/sec (Gbs/sec).

Nevertheless, a need exists in the electronic industry to process data at even greater data rates. Thus, there is a corresponding need for a latch circuit configuration having reduced setup and hold delays to process data at such greater data rates.

SUMMARY OF THE INVENTION

The invention advantageously employs a novel latch circuit design that substantially reduces inverter-based setup and hold times. A latch circuit in accordance with the invention includes first and second input switches connected to a sense amplifier configuration. It is possible for the input switches to receive complementary signals of a balanced input signal. The latch circuit operates in initialization and output modes based on the signal level of an alternating clock signal. The output mode produces an output signal having a first or second signal magnitude based on the magnitude of the input signal at the end of the initialization mode.

In particular, a latch circuit in accordance with the invention includes first and second transistors coupled to each other at a first junction and in series between a first voltage source and a controllable enable switch coupled to a second voltage source. A gate of the second transistor is coupled to a first controllable input switch receiving an input signal. In a corresponding manner, third and fourth transistors are coupled to each other at a second junction and in series between the first voltage source and the controllable enable switch. Also, a gate of said fourth transistor is coupled to a second controllable input switch receiving a complementary input signal or a particular biasing voltage. The two pairs of first and second and third and fourth transistors are cross-coupled with the gates of the first and third transistors coupled to the second and first junctions, respectively.

A controllable initialization switch is disposed between the first and second junctions. The four switches are controlled by an alternating clock signal, wherein when the clock signal is at a first signal level, the enable switch electrically connects the second and fourth transistors to the second voltage source while the other switches are open circuited causing the latch to operate in its output mode. When the clock signal is at a second signal level, the input switches provide the input signals to the gates of the second and fourth transistors and the initialization switch electrically connects the first and second junctions while the enable switch is open circuited causing the latch to operate in its initialization mode.

In an exemplary operation, when the clock signal is at a first signal level operating the latch circuit in the initialization mode, the input switches connect complementary signals of a balanced input signal to the gates of the second and fourth transistors. As a consequence, the second and fourth transistors are biased based on the signal level of the input signals. However, since the initialization switch connects the first and second junctions together during the initialization mode, the latch output signal is maintained at a magnitude level between the first and second output signal magnitudes independent of magnitude variations of the received input signal.

Then, when the clock signal changes to the second signal level, the initialization switch is open circuited and the enable switch closes causing current to flow through the second and fourth transistors based on their biasing caused by the input signals. The current flowing through these transistors causes respective first or second output signal magnitude levels to occur at the first and second junction relatively rapidly. Such transition occurs without the inverter delays associated with conventional latches.

Further, during the output mode, the input signals are disconnected from the transistors by the input switches to avoid negative effects of variations of the input signal on the latch operation. Accordingly, the only setup and hold time associated with a latch according to the invention is the relatively short time interval required for the output signal to transition from the intermediate level during the initialization mode to the first or second output signal magnitude levels. For example, it is possible for such setup and hold time to be below 100 psec. based on current CMOS integrated circuit technology.

This latch circuit only generates an output signal for one-half the period of the clock signal as the output signal returns to its intermediate state during the initialization periods. However, it is possible to couple the circuit's output to the input of a conventional static latch for providing a flip-flop having a corresponding stable output signal substantially over an entire clock period. A latch output in accordance with the invention is also useable in other circuit configurations including, for example, high speed serial-to-parallel converters, registers, level shifters and sense amplifiers.

In accordance with another aspect of the invention, resistive elements are coupled to the first and second junctions to maintain the output signal magnitude during the initialization period to a substantially mid-point between the first and second output signal magnitudes to substantially reduce the time required for such signal to transition to one of the two output signal magnitudes. Further, optional cross-coupling switches are useable to amplify the input signal to further reduce the output signal transition times as the latch alternates from the initialization mode to the output mode. Such a configuration advantageously enables detection of relatively small input signal transitions while generating output signals having greater magnitudes.

Additional features and advantages of the invention will become more readily apparent from the following detailed description and accompanying drawings.

DETAILED DESCRIPTION

Figure 2:
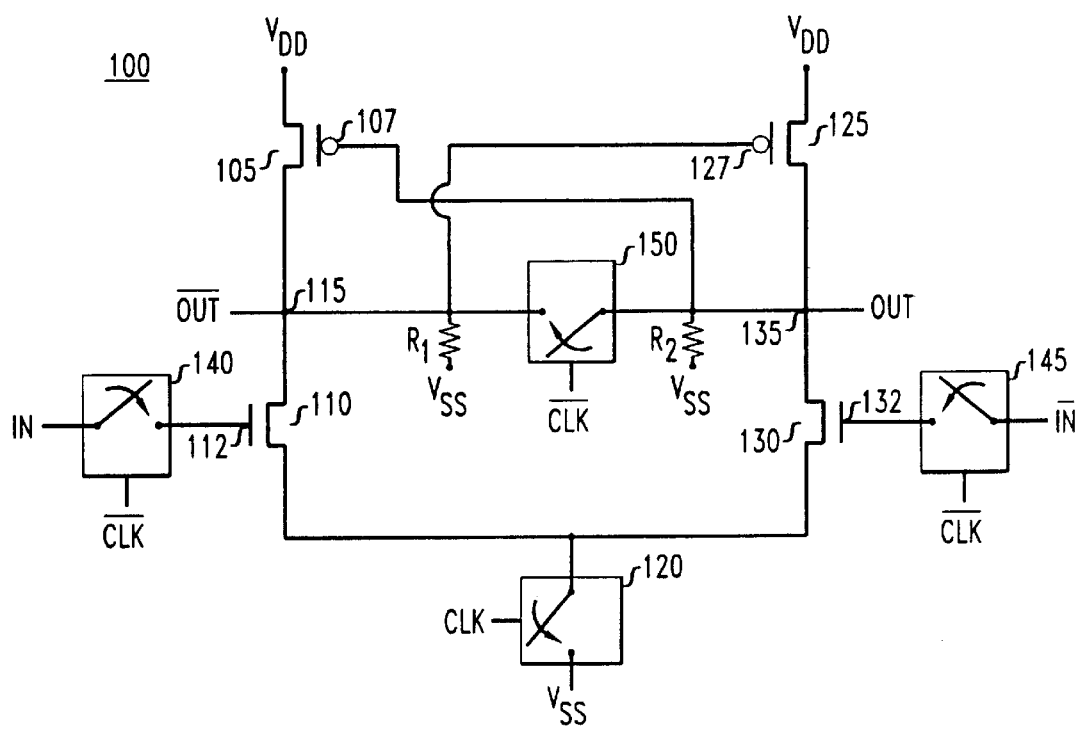
FIG. 2 illustrates a schematic block diagram of an exemplary clock-enabled latch circuit according to the invention.

An exemplary latch circuit 100 in accordance with the invention is illustrated in FIG. 2. The latch circuit 100 includes first and second transistors 105 and 110 coupled together at a first junction 115, and third and fourth transistors 125 and 130 coupled together at a second junction 135. The first and third transistors 105 and 125 are further coupled to a voltage source $V_{DD}$. The second and fourth transistors 110 and 130 are further coupled to an enable switch 120 that is further coupled to a voltage source $V_{SS}$. The enable switch 120 is controllable by a clock signal CLK to connect or disconnect the voltage source $V_{SS}$ to or from the second and fourth transistors 110 and 130 in a manner described in detail below.

More specifically, the clock signal alternates between intervals of first and second signal levels, such as voltage or current levels. When the clock signal CLK is at the first signal level, the switch 120 is closed connecting the second voltage source to the transistor 110. In a similar manner, when the clock signal CLK is at the second signal level, such as a different particular voltage, the switch 120 is opened disconnecting the second voltage source from the transistor 110.

Input switches 140 and 145 controllably provided input signal IN and a corresponding complementary input signal $\overline{IN}$ to gates 112 and 132 of the second and fourth transistors 110 and 130, respectively. The signals IN and $\overline{IN}$ represent respective portions of a balanced input signal. The complementary input signal $\overline{IN}$ is 180° out of phase with the input signal IN. Balanced signals provide the advantage of high common mode noise rejection. As a consequence, balanced signals can substantially reduce the effects of inductive noise caused by a dynamic voltage difference between respective ground planes of a circuit assembly, such as a PWB, and an integrated circuit mounted thereto.

The input switches 140 and 145 are also controlled by the clock signal CLK. However, the input switches 140 and 145 work in the opposite manner to the enable switch 120.

Accordingly, the switches 140 and 145 open, disconnecting the input signals IN and $\overline{\text{IN}}$ from the transistors 110 and 130, when the clock signal CLK is at its first signal level and close, connecting the input signals IN and $\overline{\text{IN}}$ to the transistors 110 and 130, when the clock signal CLK is at its second signal level.

The clock signals controlling the input switches 140 and 145 are labeled as complementary signals $\overline{\text{CLK}}$ because the switches 140 and 145 operate in an opposite or complementary manner to the enable switch 120. However, it should be readily understood that it is possible for the latch circuit 100 to operate based on a single clock signal CLK instead of a balanced clock signal. In a single clock signal implementation of the invention, the type of switches used for the input switches 140 and 145 operate in an opposite manner to the particular type of switch used for the enable switch 120.

The first and second junctions 115 and 135 are further cross-coupled to gates 127 and 107 of the third and first transistors 125 and 105, respectively. Also, the first and second junctions 115 and 135 are connected to an initialization switch 150. The initialization switch 150 operates based on the clock signal CLK in a substantially identical manner to the input switches 140 and 145. Accordingly, the first and second junctions 115 and 135 are connected to one another when the clock signal is at the second signal level and disconnected from one another when the clock signal is at the first signal level. The first and second junctions 135 and 115 further provide the respective output signal portions OUT and its complement $\overline{\text{OUT}}$ of a balanced output signal.

Optional resistive elements $R_1$ and $R_2$ are connected between the second voltage source $V_{SS}$ and the respective first and second junctions 115 and 135. This optional feature of the resistive elements $R_1$ and $R_2$ provides an enhanced reduction in delay times in providing an output signal in one of two states based on input signals to the latch circuit 100 as described in greater detail below.

It is possible for the transistors, switches and resistive elements of the latch circuit 100 to be formed on a single integrated circuit, multiple integrated circuits or in discrete components. The switches 120, 140, 145 and 150 are schematically represented as electro-mechanical switches for ease of illustration purposes only. However, it is desirable to use solid state switches such as transistors for any or all of the switches 120, 140, 145 and 150. Such solid state switches facilitate implementing the latch circuit 100 having compact dimensions and relatively low power requirements.

In an alternative manner, it is possible to use a conventional transmission gate configuration for the switches 120, 140, 145 and 150. A transmission gate includes a parallel connection of an n-channel transistor and p-channel transistor, wherein the complementary clock signals are provided to the respective gates of such transistors to provide the desired switch operation. The use of transmission gates is advantageous relative to single transistor switches because it allows the input signal to be delivered to the transistors 110 and 120 without signal degradations due to the known back-gate-bias effect of a single transistor. Either single transistor or transmission gate switches enable the formation of numerous latch circuits advantageously within a single integrated circuit.

The exemplary latch circuit 100 uses p-channel field effect transistors (FETs) for the first and third transistors 105 and 125 and n-channel FETs for the second and fourth transistors 110 and 130. The p-channel and n-channel FETs work in opposite manner. For example, the p-channel FET 105 provides a current flow between the voltage source $V_{DD}$ and the first junction 115 whenever the transistor gate 107 is biased near its threshold voltage such as, for example, $V_{DD}$-0.9V for conventional CMOS integrated circuits. As this voltage approaches ground, the transistor 105 is fully enabled and permitting a substantially maximum current to flow through it. In contrast, the n-channel FET 110 tends to provide a substantially maximum current between the enable switch 120 and the first junction 115, whenever the transistor gate 112 is biased to the voltage $V_{DD}$. As the biasing of the n-channel FET 110 decreases below $V_{DD}$, current flow through the transistor 110 is reduced. Current flow through the transistor 110 ceases when the gate biasing voltage is reduced below the transistor's threshold voltage which is, for example, 0.7 V in conventional CMOS integrated circuits. Further, with the use of such CMOS transistors, it is possible to use a relative voltage on the order of 2.7 V to 5 V and 0 V, for the voltages $V_{DD}$ and $V_{SS}$, respectively.

In operation, the clock signal CLK alternates between periods of its first and second signal levels causing the latch circuit 100 to alternatively operate in respective initialization and output modes. When the clock signal CLK is at its first signal level, the latch circuit 100 operates in the output mode with the enable switch 120 closed, connecting the transistors 110 and 130 to the second voltage source $V_{SS}$ and the input and initialization switches 140, 145 and 150 opened, disconnecting the input signals IN and $\overline{\text{IN}}$ from the transistors 110 and 130 and the first and second junctions 115 and 135 from one another. In contrast, when the clock signal CLK is at its second signal level, the latch circuit 100 operates in the initialization mode with the enable switch 120 opened disconnecting the transistors 110 and 130 from the second voltage source $V_{SS}$ and the input and initialization switches closed connecting the input signals IN and $\overline{\text{IN}}$ to the transistors 110 and 130 and the first and second junctions 115 and 135 to one another.

More specifically, during the period when the clock signal CLK is at its second signal level and the latch circuit 100 operates in the initialization, mode, the closed initialization switch 150 connects the first and second junctions 115 and 135 together causing the same voltage potential to occur at both junctions. As a consequence, the latch circuit 100 output signal OUT and its complement $\overline{\text{OUT}}$ are maintained at the same signal level during the initialization mode. Also, during the initialization mode, the closed input switches 140 and 145 connect the input signal IN and its complement $\overline{\text{IN}}$ to the gates 112 and 132 of the transistors 110 and 130. Accordingly, the transistors 110 and 130 are biased in respective complementary manners due to the complementary signal magnitudes of the biasing input signals IN and $\overline{\text{IN}}$. However, such complementary transistor biasing does not effect the output voltage signal at the first and second junctions 115 and 135 because the enable switch 120 is opened preventing current to flow from the voltage source $V_{DD}$ through the series connected transistors 105 and 110, and 125 and 130, to the voltage source $V_{SS}$.

Then, when the clock signal CLK alternates to the first signal level, the latch circuit 100 switches from the initialization mode to its output mode. As a result of the clock signal CLK entering its first signal level, the input switches 140 and 145 are opened causing the voltage magnitudes of the respective input signal portions IN and $\overline{\text{IN}}$ at the time the switch was opened to remain at the transistor gates 112 and 132 independent of subsequent changes to the input signal portions during the interval of the output mode. Thus, the second and fourth transistors 110 and 130 remain biased to the same extent of biasing caused by the input signal portions IN and $\overline{\text{IN}}$ at the time of the transition of the clock signal CLK from its second signal interval to its first interval. Also, such transition causes the initialization switch 150 to open disconnecting the first and second junctions 115 and 135 from one another. Thus, the junctions can then operate at different voltage magnitudes.

The transition of the clock signal CLK from its second signal interval to its first interval further causes the enable switch 120 to close allowing current to flow between the voltage sources $V_{DD}$ and $V_{SS}$ through the respective series connected transistors 105 and 110, and 125 and 130. However, the respective biasing of the transistors 110 and 130, due to the input signal portions IN and $\overline{IN}$ at the time of transition between modes, determines the extent of the current permitted to flow through such transistors. Further, since the input portions IN and $\overline{IN}$ represent a balanced input signal, the n-channel transistors 110 and 130 would be biased in a complementary manner with one of the transistors 110 and 130 enabling a greater current to flow through it than the other.

The difference in current flow through the transistors 110 and 130 correspondingly effects the voltage signal present at the junctions 115 and 135. In particular, greater current flow through one of the n-channel transistors 110 and 130 causes the voltage signal at the associated junction 115 or 135 to be pulled to a corresponding magnitude approaching $V_{SS}$. For example, if the voltage signal at the first junction 115 was lowered closer to the voltage $V_{SS}$ rather than $V_{DD}$ then the voltage signal at the second junction 135 would be raised to closer to the voltage $V_{DD}$ rather than $V_{SS}$. Such changes in the voltage signals at the junctions 115 and 135 have an advantageous secondary effect to the cross-coupling with the p-channel transistors 105 and 125. In the previously stated example, the lower voltage signal at the first junction 115 would bias the p-channel transistor 125 such that greater current would flow through the transistor 125 causing the voltage signal at the second junction 135, which is relatively high due to the complementary biasing of the transistor 130, to be pulled higher and closer to the voltage $V_{DD}$. In a corresponding manner, this elevated voltage at the at the second junction 135 biases the p-channel transistor 105 reducing the current flowing through the transistor 105 enabling the voltage at the first junction to be pulled closer to the voltage $V_{SS}$. Accordingly, the transistors 105, 110 and 125 and 130 effectively operate as a sense amplifier during the output mode of operation.

As the voltage signal at the first junction approaches $V_{SS}$, the transistor 125 would cause the voltage at the second junction 135, or OUT, to approach the voltage $V_{DD}$. In a corresponding manner, this voltage signal forces the transistor 105 to substantially reduce the current flowing through it enabling the transistor 110 to pull the signal at the first junction 115, or $\overline{OUT}$, low approaching the voltage $V_{SS}$.

Accordingly, when the input signal portions IN and $\overline{IN}$ are at high and low signal levels, respectively, at the time of transition from the latch's initialization mode to the output mode, then the balanced output signal portions OUT and $\overline{OUT}$ would likewise be at high and low signal levels, respectively. Moreover, since the latch 100 has a symmetrical configuration, when the input signal portions IN and $\overline{IN}$ are at low and high signal levels, respectively, at the time of transition from the latch's initialization mode to the output mode, then the balanced output signal portions OUT and $\overline{OUT}$ would also likewise be at low and high signal levels, respectively.

Such output signal magnitudes would be maintained by the latch circuit 100 during the duration of the output mode independent of changes in the input signal portions IN and $\overline{IN}$ because the input signal portions are disconnected from the transistors 110 and 130 during the output mode. However, when the clock signal CLK returns to its second signal level, the latch circuit 100 would revert to its initialization mode with the initialization switch closed causing the output signal portions OUT and $\overline{OUT}$ to be at the same voltage signal level between the voltages $V_{DD}$ and $V_{SS}$ and the previously described process is repetitively performed again.

Thus, the latch circuit 100 advantageously generates a balanced output signal OUT and $\overline{OUT}$ at particular complementary signal levels based on the complementary signal level of the balanced input signals IN and $\overline{IN}$ at the time the clock signal CLK transition that causes the latch to alternate to its output mode from its initialization mode without inverter delays that would cause the latch circuit to misread, i.e., read the input signal at the time of the transition. The cross-coupled configuration of the transistors 105 and 125 enables the latch circuit 100 to reach stable output signal levels for signals OUT and $\overline{OUT}$ with relatively little delay such as, for example, on the order of 150 psec. employing conventional CMOS integrated circuit devices when the high and low signal level difference of the input signals IN and $\overline{IN}$ is on the order of the difference between the voltages $V_{DD}$ and $V_{SS}$.

Such advantageous delay times are achievable using resistance values for the optional resistive elements $R_1$ and $R_2$ that cause, during the initialization mode, the common voltage signal magnitude at the first and second junctions 115 and 135 to be approximately a mid-point voltage of $(V_{DD}-V_{SS})/2$. Exemplary resistance values useable for the elements $R_1$ and $R_2$ to achieve such a voltage are on the order of 50 kΩ. It is possible to employ passive devices such as resistors for the elements $R_1$ and $R_2$. It is alternatively possible to employ active devices such as, for example, MOS transistors with an exemplary minimum channel width and length of 5 μm. As a consequence of the mid-point voltage setting, when the latch circuit 100 enters the output mode, the time interval required for the voltage signal at either of the junctions 115 and 135 to reach the full scale voltage magnitude level of $V_{DD}$ or $V_{SS}$ is similar. This configuration balances the output signal resolution time of the latch independent of the initial polarities of the input signals IN and $\overline{IN}$.

Different resistance values for the elements $R_1$ and $R_2$ or no resistance values are useable according to the invention to provide a different common voltage magnitude at the junctions 115 and 135 other than $(V_{DD}-V_{SS})/2$. However, either the rise time or fall time would be increased relative to the other because the starting voltage magnitude at the transition from the initialization to the output mode would no longer be an approximate midpoint between the voltages $V_{DD}$ and $V_{SS}$.

Figure 1:
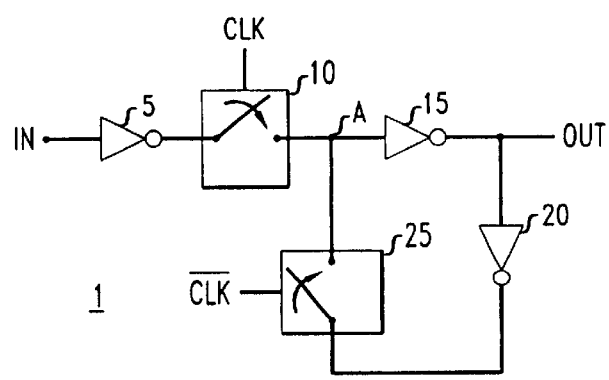
FIG. 1 illustrates a schematic block diagram of a conventional static latch circuit.

Accordingly, the latch circuit output signals corresponds to the input signals only when the clock signal is a particular signal level. For instance, if the clock signal CLK was generated having a 50% duty cycle, then the latch circuit 100 produces a valid output signal for only one-half of every clock period. However, if such output is desired for the entire clock period interval of the clock signal CLK, then the latch circuit 100 can be used in conjunction with a conventional latch circuit, such as the latch circuit 1 shown in FIG. 1. In such an arrangement, the output signal OUT of the latch circuit 100 is used as the input to the conventional latch circuit, while the clock signal CLK is used as a common clock signal for both latch circuits. The corresponding output signal of the conventional latch circuit would correspond to the desired output signal over an entire period, but with some added delay, but without misreading of data due to input signal variations at the time of the clock signal transitions.

Although p-channel FETs are shown for the first and third transistors 105 and 125 and n-channel FETs are shown for the second and fourth transistors 110 and 130, it is possible to implement the latch circuit 100 according to the invention using n-channel FETs for the transistors 105 and 125 and p-channel FETs for the transistors 110 and 120, if connections to the first and second voltages sources $V_{DD}$ and $V_{SS}$ and the-switch control signals CLK and $\overline{CLK}$ for the switches 120, 140, 145 and 150 are interchanged, respectively. Further, it is possible to implement the latch circuit 100 using other types of transistors such as emitter coupled logic (ECL) transistors and bipolar-junction transistors (BJT), as long as the first and third transistors 105 and 125 operate in an effectively opposite manner to the second and fourth transistors 110 and 130.

Figure 3:
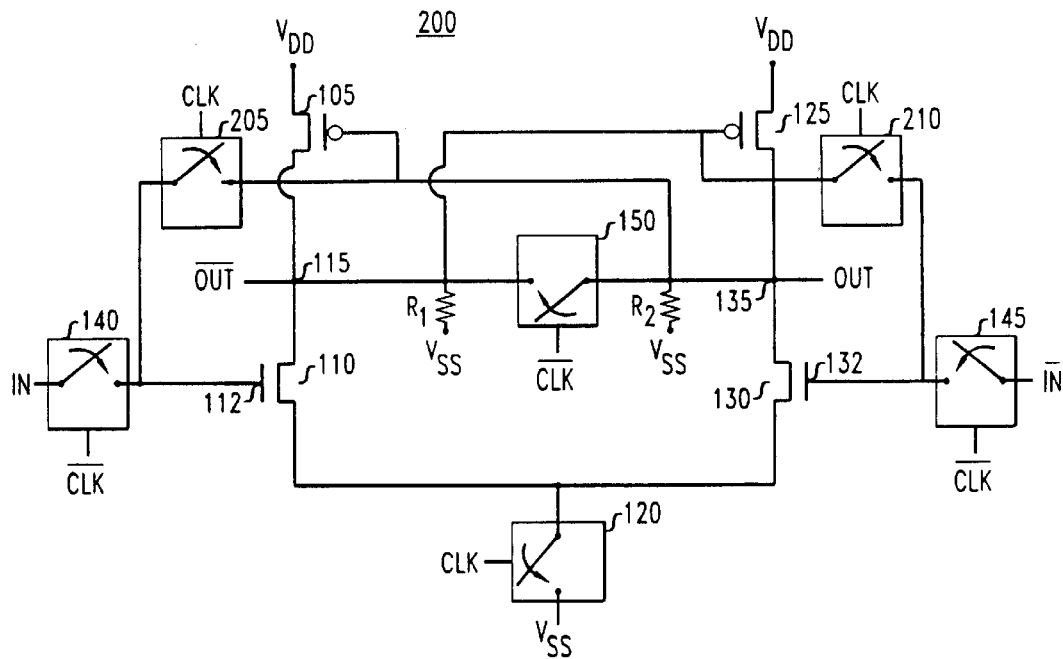
FIG. 3 illustrates a schematic block diagram of an exemplary alternative embodiment according to the invention of the latch circuit of FIG. 2.

FIG. 3 illustrates a latch circuit 200 according to the invention similar to the latch circuit 100 of FIG. 2 employing optional cross-coupled switches 205 and 210 to provide static latching and advantageous amplification of the input signals IN and $\overline{IN}$ as well as facilitates an even further reduction in the setup and hold time. Similar components in FIGS. 2 and 3 are liked numbered for ease of explanation, such as the transistors 105, 110, 125 and 130 and switches 120, 140, 145 and 150.

In FIG. 3, the cross-coupled switches 205 and 210 connect the gates 112 and 132 of the transistors 110 and 130 to the second and first junctions 135 and 115, respectively. The cross-coupled switches 205 and 210 are controllable by the clock signal CLK and operate in a substantially identical manner to the enable switch 120. Accordingly, the cross-coupled switches 205 and 210 electrically connect the transistor gates 112 and 132 to the second and first junctions 135 and 115 when the latch circuit 200 is operating in its output mode. The transistor gates 112 and 132 are disconnected from the second and first junctions 135 and 115, when the latch circuit 200 is operating in its initialization mode.

In operation, the cross-coupled switches 205 and 210 further enable the junctions 115 and 135 to be effectively pushed or pulled to the appropriate output signal level in a relatively quicker manner upon transition of the latch circuit 200 from the initialization mode to the output mode to even further reduce the output signal delay. Accordingly, it is possible for the latch circuit 200 to generate an output signal with an advantageous relatively small setup and hold time on the order of 100 psec. when implemented with conventional CMOS integrated circuits. As a consequence, the latch circuit 200 is advantageously useful for detecting and processing data received at relatively high data rates, such as on the order of 2 Gbs/sec. or greater.

Also, the cross-coupled configuration enables the latch circuit 200 to detect relatively small signal differences in the input signals IN and $\overline{IN}$ on the order of, for example, 50 mV, and generate conventional CMOS output signals OUT and $\overline{OUT}$ in the range of 2.7V to 5.0V using conventional CMOS integrated circuits. However, the smaller the voltage difference, the longer it takes to produce the output signals OUT and $\overline{OUT}$ at the desired signal magnitudes. For example, at voltage difference in the input signals IN and $\overline{IN}$ of 50 mV, a latch according to the invention employing conventional CMOS integrated circuits can operate on data being received at a rate of 250 Megabits/sec. (Mbs/sec.) while maintaining conventional CMOS output signal levels.

Also, it is possible for a latch circuit according to the invention, such as the circuits 100 and 200 of FIGS. 2 and 3, to receive and generate single, non-balanced input and output signals. A simple modification to the circuits 100 and 200 enable such single input signal processing. In particular, the complementary input signal $\overline{IN}$ to the input switch 135 of the latch circuits 100 and 200 is substituted with a voltage source $V_P$ having a voltage magnitude of approximately the mid-point between the high and signal levels of the input signal. Such a resulting single input signal latch circuit possesses only slightly longer signal delays than a corresponding balanced input latch circuit according to the invention, but is still superior to conventional latch circuits.

A latch circuit in accordance with the invention such as the exemplary latch circuits 100 and 200 is useable in numerous circuit configurations including, for example, registers, level shifters and sense amplifiers. Also, it is possible to couple a latch circuit's output to the input of a conventional static latch, such as that depicted in FIG. 1, for providing a flip-flop having a corresponding stable output signal over an entire clock period. Such a flip-flop configuration provides a single output signal. An exemplary flip-flop configuration 250 according to invention providing a balanced output signal over an entire clock period is shown in FIG. 4.

Figure 4:
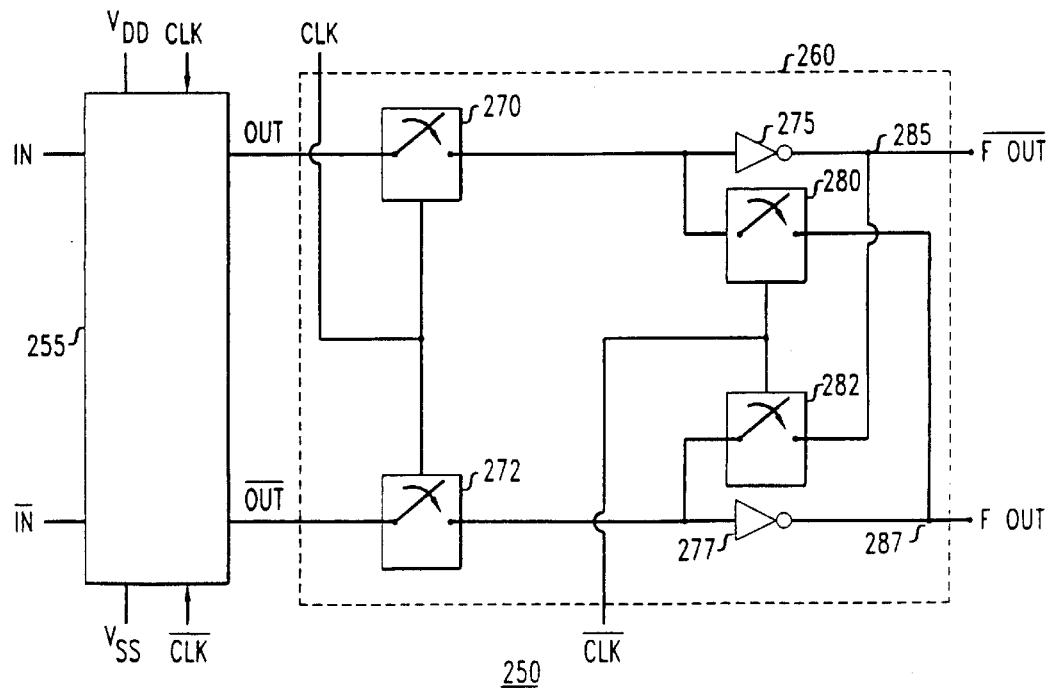
FIG. 4 illustrates a schematic block diagram of an exemplary flip-flop employing the latch circuit of FIG. 2 or 3.

In FIG. 4, a latch circuit 255 according to the invention, such as the latch circuit 100 or 200 of FIGS. 2 and 3, has its output signals OUT and $\overline{OUT}$ provided to a cross-coupled static latch 260. An exemplary circuit configuration for the cross-coupled static latch 260 is depicted within the dashed-outline representing the latch 260. The exemplary configuration includes a first pair of controllable switches 270 and 272 for receiving the latch output signals OUT and $\overline{OUT}$ of the latch 255. The switches 270 and 272 are further connected to respective inverters 275 and 277. The operation of the switches 270 and 272 are controlled by the clock signal CLK. Outputs 285 and 287 of the inverters 275 and 277 provide output signals $\overline{FOUT}$ and FOUT for the flip-flop 250. Further, a second pair of switches 280 and 282 are cross-coupled between the first pair of switches 272 and 270 and the inverter outputs 285 and 287. The operation of the second pair of switches 280 and 282 are controlled by the complementary clock signal $\overline{CLK}$.

In operation, when the clock signal CLK is at a high signal level, the latch 255 is operating in its output mode, and the first pair of switches provide the latch output signals OUT and $\overline{OUT}$ to the inverters 275 and 277 of the static latch 260. During this time interval, the latch circuit 255 generates its output signals based on the input signals IN and $\overline{IN}$ during the previous initialization mode interval as is previously described with regard to FIGS. 2 and 3. Further, during such time interval, the corresponding low signal level of the complementary clock signal $\overline{CLK}$ causes the switches 280 and 282 to disconnect the cross coupling of the inverters 275 and 277. As a consequence, the inverters 275 and 277 generate the flip-flop output signals $\overline{FOUT}$ and FOUT based on the received latch output signals OUT and $\overline{OUT}$.

Then, when the clock signal CLK alternates to its low signal level and the latch 255 is operating in its initialization mode, the first pair of switches disconnect the latch output signals OUT and $\overline{OUT}$ from the inverters 275 and 277. Further, at such time interval, the corresponding high signal level of the complementary clock signal $\overline{CLK}$ causes the second pair of switches 280 and 282 to cross-couple the inverters 275 and 277 causing the flip-flop output signals $\overline{FOUT}$ and FOUT continue to be maintained at their present signal levels. As a consequence, the flip-flop 250 generates its output signals $\overline{FOUT}$ and FOUT based on the input signals IN and $\overline{IN}$ received by the latch 255 for an entire clock period.

Figure 5:
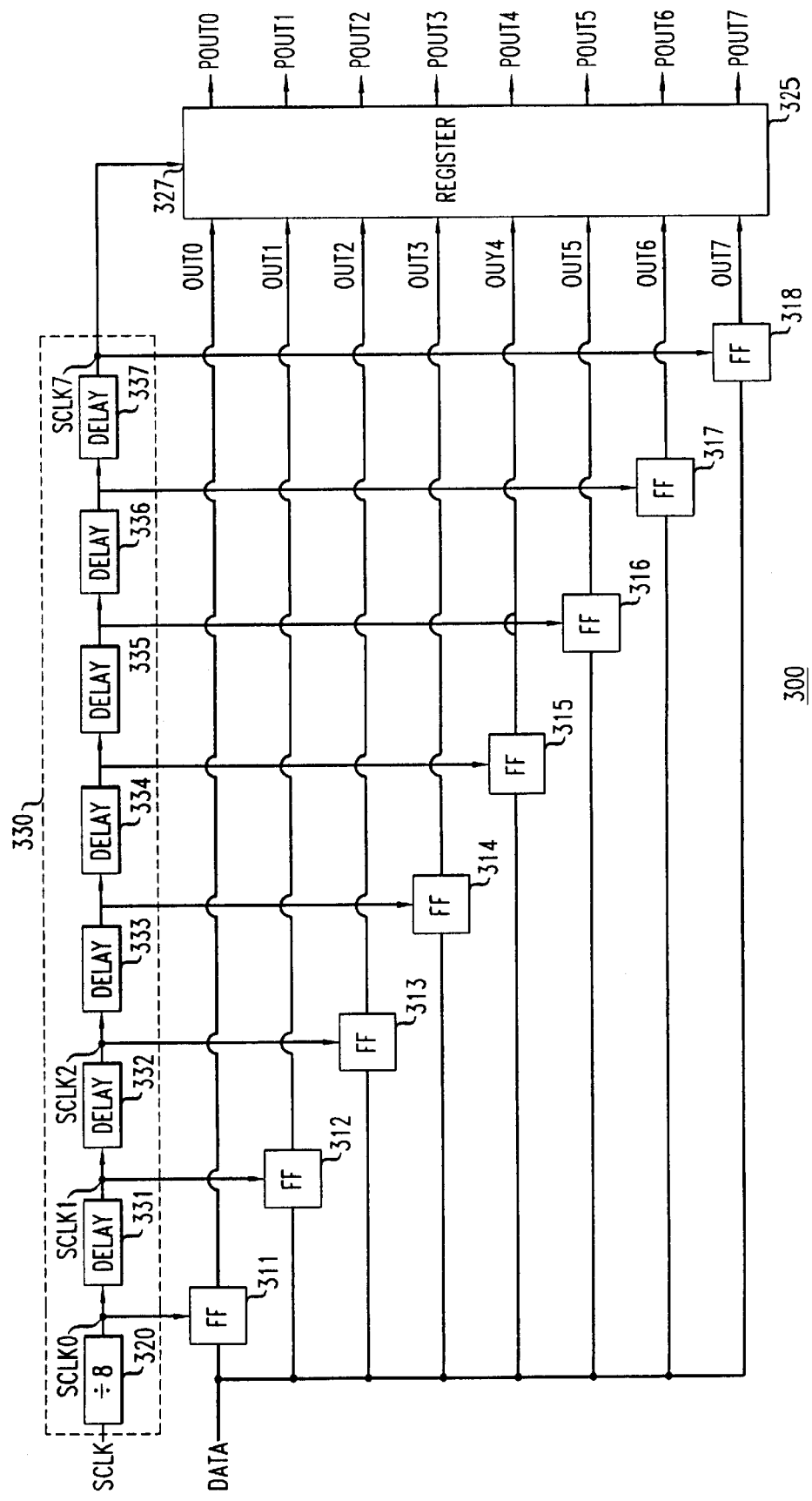
FIG. 5 illustrates a schematic block diagram of an exemplary serial-to-parallel converter according to the invention employing, for example, the flip-flop circuit of FIG. 4.

Flip-flop circuits in accordance with the invention are useable to construct advantageous serial-to-parallel converters capable of operating on serially transmitted data signals at relatively high transmission rates. FIG. 5 illustrates an exemplary serial-to-parallel converter 300 in accordance with the invention employing eight flip-flops 311–318. It is possible to employ single data and clock control signals for the flip-flops 311–318 using, for example, the latches 100 or 200 in conjunction with respective static latches, such as the conventional latch configuration shown in FIG. 1. Also, it is possible to employ balanced complementary clock signals as well as a balanced complementary input signal and output parallel signals in the manner previously described with respect to FIG. 4. However, the converter 300 of FIG. 5 has been shown employing single data and clock control signals for the flip-flops for ease of illustration purposes only.

In operation, the converter 300 receives a data signal DATA having intervals representing respective information bits. The converter 300 than sequentially processes respective consecutive intervals in the data signal DATA of eight information bits to sequentially generate parallel signals POUT0–POUT7 representing the respective received eight bits of information. The converter 300 further includes a clock signal SCLK having transitions between first and second clock signal levels synchronous with the information bit intervals of the data signal DATA. The clock signal SCLK is provided to a clock divider circuit 320 in a control signal generator 30 that produces a divided clock signal SCLK0 having a clock period eight times longer than the period of the clock signal SCLK. The divider circuit 320 is coupled to the first flip-flop 311 as well as to a first delay device 331 in the control signal generator 330. The divided clock signal SCLK0 is used as a first control signal for the first latch circuit 311. The flip-flop 311 produces an output signal OUT0 which is provided to an eight bit buffer register 325.

Delay devices 331–337 in the control signal generator 330 are coupled to the flip-flops 312–318 in a cascaded manner to provide corresponding delayed control signals based on the synchronous clock signal SCLK. The flip-flops 312–318 provide respective output signals OUT1–OUT7 to the buffer register 325 in a similar manner to the flip-flop 311. More specifically, in the cascaded circuit arrangement, the first delay device 331 generates a second control signal SCLK1 in a delayed manner based on the receipt of the first control signal SCLK0. The time interval of the delay between the receipt of the first control signal and the generation of the second control signal SCLK1 by the first delay device 331 is substantially equivalent to the time interval employed by the data signal DATA to represent a single information bit.

The second control signal SCLK1 generated by the first delay device 331 is provided to the second flip-flop 312 and to a second delay circuit 332. The second delay device 332 generates a third control signal SCLK2 based on receipt of the second control signal SCLK1 at a substantially equivalent delayed interval as the first delay device 331. The third control signal SCLK2 is likewise provided to the flip-flop 313 as well as a third delay device 333. The third delay device 333 as well as delay devices 334–337 are coupled in a substantially identical cascaded manner to the first and second delay devices 331 and 332 to provide respective delayed control signals to the remaining flip-flops 314 to 318.

Further, the eighth control signal SCLK7 generated by the delay device 337 is provided to an enable input 327 of the buffer register 325 in addition to the flip-flop 318. The buffer register 325 generates the parallel output signals POUT0–POUT7 based on its input signals OUT0–OUT7 at the time a positive edge signal transition is detected in the control signal SCLK7 at its enable input 327. However, the buffer register 325 also maintains its outputs at the generated signal levels during the periods when a positive edge signal transition is not detected in its enable input signal independent of changes in the input signals OUT0–OUT7 during such time.

Figure 6:
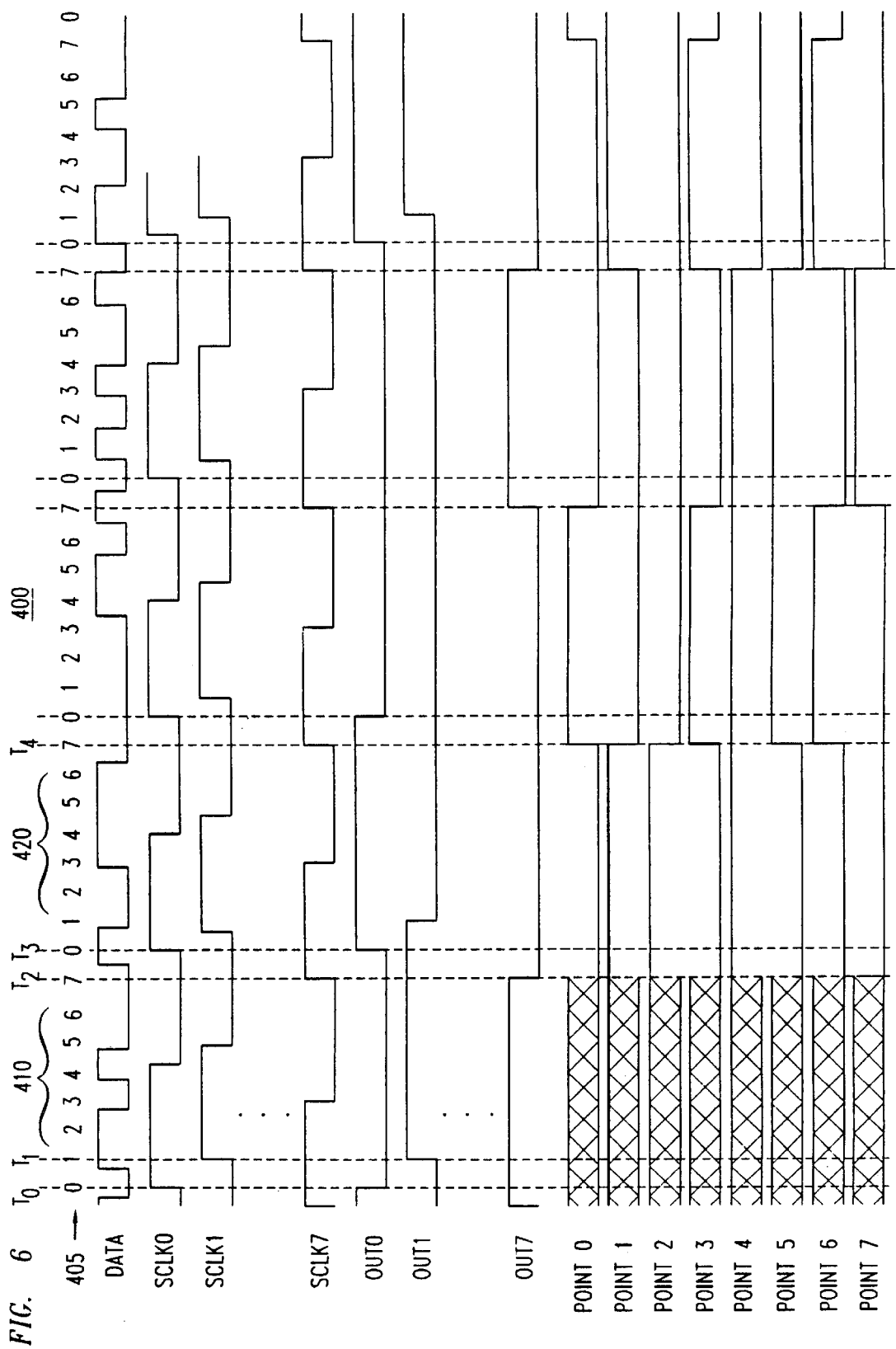
FIG. 6 illustrates a waveform timing diagram representing an exemplary operation of the converter of FIG. 5.

FIG. 6 illustrates a signal timing diagram 400 representing an exemplary operation of the converter 300 of FIG. 5. Waveforms in FIG. 6 corresponding to signals of FIG. 5 contain identical reference labels for ease of explanation, for example, control signal SCLK0, data signal DATA and flip-flop output signals OUT0, OUT1 and OUT7. Further, in FIG. 6, intervals of the data signal DATA representing respective information bits are indicated by bit position numbers 405. Also, waveforms for only divided clock signal or control signal SCLK0 and corresponding delayed control signals SCLK1 and SCLK7 are shown for ease of illustration purposes. Likewise, waveforms for only the flip-flop output signals OUT0, OUT1 and OUT7 are shown in FIG. 6. However, all eight parallel output signals POUT0–POUT7 are shown.

Operation of the converter 300 of FIG. 5 is described with reference to that figure as well as the waveform timing diagram 400 of FIG. 6. The leading or positive edge of the divide clock signal or first control signal SCLK0 is generated at the time of receiving a first information bit of a sequence of eight information bits as shown, for example, at time $T_0$, in FIG. 6. Time $T_0$ is the start of the receipt of a sequence 410 of eight information bits in the data signal DATA. The first control signal SCLK0 is provided to the clock input of the first flip-flop 311 causing the flip-flop 311 to generate the output signal OUT0 based on the information bit interval or signal level received for the data signal DATA at time $T_0$.

Accordingly, the flip-flop 311 generates the output signal OUT0 at a low signal level because, at time $T_0$, the data signal DATA is at a low signal level. The flip-flop 311 generates the output signal OUT0 at the low signal level for the duration of the period of the first control signal SCLK0 ending at time $T_3$. The first control signal SCLK0 is also provided the delay device 331 in FIG. 5 which generates a second control signal SCLK0 at time $T_1$. The second control signal SCLK1 is substantially identical to the first control signal SCLK0 but is delayed by a time period corresponding to an interval of an information bit in the data signal DATA. Thus, as shown in FIG. 6, the period between times $T_0$ and $T_1$ corresponds to an information bit interval of the signal DATA.

The generation of the control signal SCLK1 at time $T_1$ causes the flip-flop 312 to generate its output signal OUT1 at a high signal level because the data signal DATA is at a high signal level at time $T_1$. The output signal OUT1 is generated for the duration of the period of the control signal SCLK1 in an identical manner as the previously described flip-flop 311 at time $T_0$. As a consequence, the first flip-flop 311 generates its output signal OUT0 corresponding to the first information bit (bit 0) of the sequence 410 in the data signal DATA and the second flip-flop 312 generates its output signal OUT1 corresponding to the second information bit (bit 1) of the sequence 410. Accordingly, after time $T_1$, the parallel signals OUT0 and OUT1 represent the first and second bits in the sequence 410 of the data signal DATA.

The third through eighth information bit representations in the sequence 410 of the data signal DATA are used for generating corresponding parallel signals OUT2–OUT7 by the flip-flops 313 through 318 in a substantially identical manner to that previously described for generating the signals OUT0 and OUT1. The last parallel signal OUT7 for the sequence is generated at a time $T_2$. Thus, at time $T_2$, the parallel signals OUT0–OUT7 correspond to the respective information bits represented in the sequence 410 of the data signal DATA. Moreover, at time $T_2$, the control signal SCLK7 has a positive edge signal transition that is provided to the buffer register 325 causing the register 325 to generate the parallel output signals POUT0–POUT7 with signal levels based on the input signals OUT0–OUT7.

As a consequence, starting at time $T_2$, the parallel output signals POUT0–POUT7 correspond to the sequence of information bits represented in the data signal DATA between times $T_0$ and $T_2$. The output signals POUT0–POUT7 are represented by cross-hatching for the time prior to time $T_2$ because such output signals would be based on the sequence of information bits represented in the data signal DATA prior to time $T_0$ which is not shown. Further, the output signals POUT0–POUT7 are not changed from their representation of the sequence 410 until the next positive transition of the control signal SCLK7 which occurs at time $T_4$.

The output signals POUT0–POUT7 are maintained at such levels even though the next sequence 420 of eight information bits is being received starting at time $T_3$. However, during the interval from time $T_3$ and $T_4$, the flip-flops 311–318 are generating output signals OUT0–OUT7 based on the information bit sequence 420 in the data signal DATA. Then, at time $T_4$, the buffer register 325 generates the output signals POUT0–POUT7 based on the information bit sequence 420. The converter 300 repeatedly performs this operation to provide a parallel signal conversion of the serially received data signal DATA. The converter 300 is useable for providing serial-to-parallel conversion on a relatively high data rate signal such as on the order of, for example, 2 Gbs/sec. using conventional CMOS integrated circuits and having a power dissipation of approximately 30 mW when the voltage difference of balanced signal inputs is on the order of 50 mV.

The converter 300 has been depicted in FIG. 5 for processing sequences of serially transmitted bytes of eight information bits for illustration purposes only. It should be readily understood that a greater or lesser number of flip-flops and delay devices are also useable to process a corresponding greater or lesser number of sequence information bits in accordance with the invention. Also, the frequency divider 320 and delay devices 331–337 in FIG. 5 have been shown forming the control signal generator 330 for ease of illustration. However, it is possible to employ numerous other types of circuits for the control signal generator 330 for generating the required control signals to the flip-flops at the desired delayed intervals including, for example, counters, shift registers, multiplexers and sequencers driven by a generated or received synchronous clock signal.

Moreover, although the converter 300 has been described using the flip-flop configuration illustrated in FIG. 5, it is alternatively possible to employ other flip-flop configurations, such as conventional D-type flip-flop configurations for the flip-flops 311–318 for operating on single or balanced signals in accordance with the invention. Also, it is possible to use other than a signal edge triggered buffer register for the register 325 including, for example, a pulse triggered register in conjunction with a pulse generator for providing pulses to the register at the desired intervals.

Although several embodiments of the invention have been described in detail above, many modifications can be made without departing from the teaching thereof. All of such modifications are intended to be encompassed within the following claims. For example, although the previously described embodiments employ latches including CMOS FET transistors, it is possible to different types of transistors in latches and converters according to the invention including, for example, ECL or BJT transistors.

The invention claimed is:

1. A serial-to-parallel converter for generating N parallel signals based on a serial data signal, the converter comprising:

N flip-flops, each flip-flop having a data input and a data output, and a clock signal input, the data input for receiving said serial data signal;

a buffer register having at least N inputs coupled to respective flip-flop data outputs and correspondingly at least N outputs for providing said generated parallel signals; and a control signal generator coupled to each of the N flip-flop clock signal inputs, said generator for producing respective control signals for the flip-flop clock signal inputs, said control signals being sequentially delayed relative to one another, wherein the delay of the respective control signals are respective multiples of an information bit interval in said serial data signal, wherein at least one of the flip-flops comprises at least one latch circuit, the latch circuit comprising:

a controllable initialization switch coupled between first and second junctions of the latch circuit;

first and second transistors coupled to each other at the first junction and in series between a first voltage source and a controllable enable switch coupled to a second voltage source, a gate of said second transistor coupled to a first controllable input switch receiving a first input signal;

third and fourth transistors coupled to each other at the second junction and in series between the first voltage source and the controllable enable switch, a gate of said fourth transistor coupled to a second controllable input switch receiving a corresponding second input signal, gates of said first and third transistors coupled to said second and first junctions, respectively; and said switches being controllable by a corresponding one of the control signals, wherein when the control signal is at a first signal level, said controllable enable switch electrically connects the second and fourth transistors to the second voltage source and wherein when the control signal is at a second signal level, the first and second controllable input switches provide the input signals to the gates of the second and fourth transistors and the controllable initialization switch electrically connects the first and second junctions.

2. The converter of claim 1, wherein said control signal generator is for producing said control signals with periods on the order of N times said information bit interval in said serial data signal.

3. The converter of claim 1 wherein said control signal generator comprises N−1 delay circuits connected in series, each delay circuit being further coupled to a respective clock signal input of the second flip-flop to the N-th flip-flop, wherein each delay circuit provides a delay on the order of an information bit interval in said serial data signal.

4. The converter of claim 1 wherein at least one of said flip-flops comprises the at least one latch circuit as a first latch circuit, and further comprises a second latch circuit having an input coupled to an output of said first latch circuit, said second latch circuit being a static latch circuit.

5. The converter of claim 1, wherein the at least one latch circuit further comprises first and second resistive elements coupled between the respective first and second junctions and the second voltage source.

6. The converter of claim 1 wherein said serial data signal comprises a balanced data signal, and further wherein said second input signal received at said second controllable input switch is a complementary signal to the first input signal received at said first input switch.

7. The converter of claim 1, wherein at least one of the first and second junctions is biased during an initialization mode to a signal level having a magnitude between magnitudes of said first and second voltage sources.

8. The converter of claim 1, wherein said at least one latch circuit further comprises first and second cross-coupling controllable switches coupled between said respective first and second junctions and respective gates of said fourth and second transistors, wherein said cross-coupling switches are controllable by the control signal such that when said control signal is at the first signal level, the first and second junctions are electrically connected to the gates of said fourth and second transistors, respectively.

* * * * *